(12) United States Patent
Mizuta et al.

(10) Patent No.: US 6,416,576 B1
(45) Date of Patent: Jul. 9, 2002

(54) METHOD FOR PRODUCING SINGLE CRYSTAL

(75) Inventors: Masahiko Mizuta, Hyogo; Tokuji Maeda, Saga; Masato Tabuchi, Hyogo, all of (JP)

(73) Assignee: Sumitomo Metal Industries, Inc., Osaka (JP)

( * ) Notice: Subject to any disclaimer, the term of this patent is extended or adjusted under 35 U.S.C. 154(b) by 0 days.

(21) Appl. No.: 09/864,936

(22) Filed: May 25, 2001

(30) Foreign Application Priority Data

Jun. 9, 2000 (JP) ........................................ 2000-173704

(51) Int. Cl.$^7$ .............................................. C30B 15/20
(52) U.S. Cl. ........................................... 117/20; 117/13
(58) Field of Search ..................................... 117/13, 20

(56) References Cited

U.S. PATENT DOCUMENTS 6,190,452 B1 * 2/2001 Sakurada et al. ............. 117/20
6,216,361 B1 * 7/2001 Iida et al. ...................... 117/19

* cited by examiner

Primary Examiner—Felisa Hiteshew
(74) Attorney, Agent, or Firm—Morrison & Foerster, LLP

(57) ABSTRACT

In pulling a single crystal by CZ method, stable pulling up is carried out in a pulling rate as fast as possible while a crystal deformation is controlled to an aimed value and density of grown-in defects is suppressed to a value below an upper limit value. As an index of deformation of the single crystal from a perfect circle, the aimed value of the crystal deformation is previously determined. The upper limit value of a pulling rate necessary to suppress a defect density to an allowable range is previously calculated from distribution of grown-in defects in the crystal section, the single crystal is pulled up according to a predetermined pulling rate, and then deviation of the achieved value from the aimed value of the crystal deformation in pulling is calculated. The deviation is converted to a correction of the pulling rate. This correction is added to a set value of the pulling rate in the pulling and the result is used as a temporary set value of the pulling rate in the next pulling. The temporary set value is compared with the upper limit value of the above described pulling rate and the smaller value is determined as the pulling rate in the next runs.

6 Claims, 4 Drawing Sheets

METHOD FOR PRODUCING SINGLE CRYSTAL

BACKGROUND OF THE INVENTION

1. Field of the Invention

The present invention relates to a method for producing a single crystal by growing a semiconductor single crystal such as a silicon single crystal from a melt by the Czochralski method (CZ method), and particularly relates to a method for producing a single crystal, in which setting of a pulling rate of the single crystal from the melt is improved.

2. Description of the Prior Art

In growing the silicon single crystal by CZ method, as publicly known, a seed crystal is dipped in the melt of silicon and the seed crystal is pulled up in this state while controlling a pulling rate to obtain a cylindrical silicon single crystal on a lower end of the seed crystal. Then, a silicon wafer, which is to be used as a material for a semiconductor device, is taken from the silicon single crystal grown.

It has been known that the pulling rate of the silicon single crystal, in other words, the pulling rate of a body portion has a large effect on the defect distribution in a radial direction of the silicon single crystal. This means that in the silicon wafer, when subjected to thermal oxidation treatment, oxidation induced stacking faults called OSF may occur in a form of a ring. A region (hereafter, this region is referred to as an OSF ring-occurring region) where this OSF may occur is known to move toward the periphery with increase in pulling rate.

While the OSF ring is a kind of thermal treatment induced defect, infrared scattering defect and dislocation cluster formed during crystal growth are called grown-in defects. Among grown-in defects, infrared scattering defects occur inside the OSF ring and degrade the gate oxide integrity. On the other hand, dislocation clusters occur outside the OSF ring appearing on both sides of a non defect region.

With a change of a diameter of the region where the OSF ring occurs due to a change of the pulling rate, the area of the region, where these grown-in defects occur, changes. Specifically, a high pulling rate will increase the diameter of the region where the OSF ring occurs and expand the area inside this region, where these grown-in defects occur. A lower pulling rate will decrease the diameter of the region where the OSF ring occurs and reduce the area inside this region, where these grown-in defects occur.

In recent years, with a lower room temperature and a lower content of oxygen in the single crystal in semiconductor producing processes, an adverse effect of the OSF on a device is being suppressed. Therefore, it has become important to reduce the density of grown-in defects, namely, infrared scattering defects occurred inside the OSF ring-occurring region, which have an adverse effect on gate oxide integrity Therefore, it is proposed to set a pulling rate such that the density of grown-in defects occurred inside the OSF ring-occurring region may be reduced.

It has been well known that the pulling rate of the silicon single crystal has also a large effect on a shape of the single crystal section. Specifically, the crystal deformation (ellipticity) expressed by (maximum diameter-minimum diameter)/minimum diameter of the same section of the single crystal increases with increase in pulling rate. When the crystal deformation increases, a product portion taken from the grown crystal decreases to lower the yield. Therefore, it is also practiced to set the pulling rate to make the crystal deformation fall within a predetermined range.

With respect to such setting of the pulling rate of the silicon single crystal, the following prior art has been disclosed in Japanese Patent Laid-Open No. 11-189489. According to Japanese Patent Laid-Open No. 11-189489, a technique for reducing the density of the grown-in defects is disclosed, wherein a profile of the pulling rate is determined in advance such that the crystal deformation is maintained within the range of from 1.5 to 2.0 percent over the full length from a top to a bottom of the body portion in the direction of pulling axis, and the profile of the pulling rate multiplied by $\alpha$ ($\leqq 0.8$) is used as an aimed profile of the pulling rate in actual crystal.

Here, $\alpha$ is a coefficient for setting the aimed value to the diameter (defect region diameter D) of the region, where grown-in defects occur, located inside the OSF ring-occurring region, and is calculated from the change rate of the defect region diameter D.

In growing the silicon single crystal, growing conditions change, for example, an amount of melt remained decreases and a heater power changes with the progress of growth and thus, if the pulling rate is maintained constant throughout the entire period of pulling, quality is likely to be deteriorated in later stages of pulling. In addition, for either the defect distribution in the crystal radial direction or the crystal deformation, the pulling rate must be gradually lowered with the progress of growth in order to yield the same profile in the full length of pulling axis direction of the body portion.

BRIEF SUMMARY OF THE INVENTION

OBJECT OF THE INVENTION

According to the prior art disclosed in the Japanese Patent Laid-Open No. 11-189489, for the following reasons, it has been described that reduction of density of grown-in defects is possible.

The crystal deformation increases with increase in crystal-pulling rate. Maintaining the crystal deformation to such relatively high range of from 1.5 to 2.0 percent fixes the OSF ring-occurring region to the outer circumferential portion of the crystal. This is used as a standard profile of the pulling rate and this value multiplied by $\alpha$ ($\leqq 0.8$) is used as the aimed profile of the pulling rate in actual crystal growth. Thus, the defect region diameter D is determined in accordance with a. When the a is selected from the range equal to or smaller than 0.8, the defect region diameter D is minimized; and the non defect region occurring in adjacent region outside the OSF ring-occurring region is effectively used. As a result, density of grown-in defects is reduced, Though the crystal deformation and the change rate of the defect region diameter D can be actually used as an index in setting the pulling rate, in practice of crystal growth, these are insufficient For example, when the change rate of the defect region diameter D is small, even if the crystal deformation is maintained in the range of from 1.5 to 2.0 percent, a set value of the pulling rate possibly increases unlimitedly. This is because when the crystal deformation is smaller than the aimed value of 1.5 to 2.0 percent, some pulling rate is always added to the aimed pulling rate profile when the pulling rate becomes too high, a stable operation cannot be performed and a situation is expected in which density of grown-in defects exceeds an assumed value.

The object of the present invention is to provide a method for producing a single crystal, allowing for minimizing density of grown-in defects as well as stable practical operation.

SUMMARY OF THE INVENTION

To achieve the above described purpose, according to this invention, a method for producing a single crystal by growing a semiconductor single crystal from a melt by CZ method is provided, wherein as an index of deformation of the single crystal from a perfect circle, an aimed value $d_{AIM}$ of a crystal deformation defined by (maximum diameter-minimum diameter)/minimum diameter of a crystal section is previously calculated; an upper limit value $V_{MAX}$ of a pulling rate necessary for suppressing a defect density to an allowable range is calculated from distribution of grown-in defect in the crystal section, the single crystal is pulled up according to a predetermined pulling rate, then deviation $\Delta d$ of the achieved value $d_{ACT}$ of the crystal deformation from said aimed value $d_{AIM}$ in pulling is calculated, the deviation $\Delta d$ is converted to a correction $\Delta V$ of the pulling rate, this correction $\Delta V$ is added to a set value of the pulling rate in said pulling; the pulling rate obtained by this addition is compared with said upper limit value $V_{MAX}$ and a smaller pulling rate is determined as the set value of the pulling rate in the next and following runs.

According to the method for producing the single crystal of the present invention, the crystal deformation is controlled to maintain the aimed value $d_{AIM}$ thereof. Density of grown-in defects in the crystal section is suppressed to the allowable range. Satisfying these conditions, pulling is carried out in a pulling rate as fast as possible. In addition, in CZ process, product specifications, such as the crystal deformation are sensitively influenced by a difference in thermal conditions in a furnace and sensitivity is very high and thus, change in pulling rate causes a big effect. However, because the value of the pulling rate added by the correction $\Delta V$ is compared with the upper limit value $V_{MAX}$ thereof, and the smaller value is used as the set value of the pulling rate in the following runs, an abrupt change of pulling rate can be avoided resulting in a more stable operation.

The aimed value $d_{AIM}$ of the crystal deformation can be the value almost corresponding to the upper limit of deformation from the perfect circle of the section of the single crystal. Consequently, deformation can be suppressed to the allowable range to enable faster pulling.

The correction $\Delta V$ (mm/min) of pulling rate can be calculated by the following equation. For this calculation a gain N is introduced and thus, the abrupt change of pulling rate can be avoided resulting in a more stable operation.

$\Delta V = N \times ef \times \Delta d$

N: gain being the value (-) falling within the range of 0.1 to 1.0 ef: effect coefficient [(m/min)/percent]

$\Delta d$: deviation (%) of crystal deformation

For the correction $\Delta V$ of the pulling rate, a calculated value of the correction $\Delta V$ of the pulling rate is compared with the allowable upper limit thereof and if the calculated value exceeds the allowable upper limit, the allowable upper limit can be used as the correction $\Delta V$ of the pulling rate. Consequently, an abrupt change of pulling rate can be avoided resulting in a more stable operation.

The pulling rate can be set at a plurality of points with the transition of the pulling length and the pulling rate in each point can be set to decrease monotonously according to the progress of pulling. Consequently, fluctuations of the crystal pulled in the later stage of pulling can be suppressed to avoid quality deterioration. Even if the pulling rate is monotonously decreased with the progress of pulling, the diameter of the crystal can be kept constant by regulation of the heater power and the like.

The crystal deformation can be smoothed on the basis of achievement of a plurality of pulling runs to use it in setting the pulling rate for the following runs. Consequently, an abrupt change of pulling rate can be avoided resulting in a more stable operation. As a method for smoothing, calculating a simple average, employing an weighted average, and employing a median can be employed.

DETAILED DESCRIPTION OF THE PREFERRED EMBODIMENTS

Figure 1:
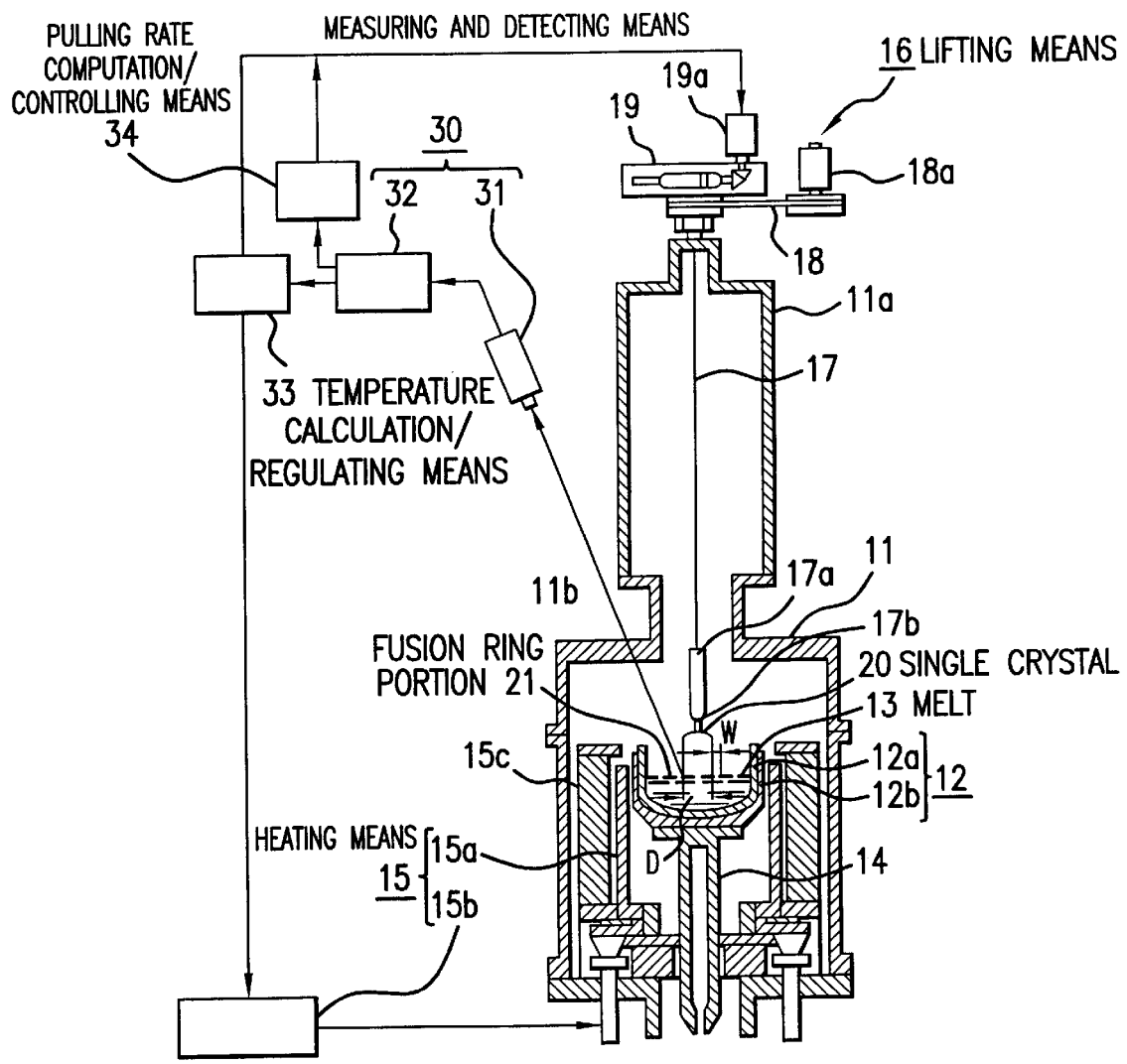
FIG. 1 is a block diagram of a crystal growing apparatus used for the method for producing a single crystal according to an embodiment of this invention.

Embodiments of the present invention are given below by way of illustration. FIG. 1 is a block diagram of a crystal growing apparatus used for the method for producing a single crystal according to embodiments, of the present invention.

The crystal growing apparatus has a cylindrical main body 11 of a furnace. In a central part of the furnace main body 11, a crucible 12 is provided. The crucible 12 has a double structure comprising a quartz crucible 12a and a graphite crucible 12b outside thereof and mounted on a rotating shaft 14 called pedestal. By driving the rotating shaft 14, the crucible 12 is rotated and lifted. In the quartz crucible 12a, a melt 13 prepared by melting a silicon material for the single crystal is contained.

For preparation of the melt 13 and control of a temperature, a heater 15a is disposed outside the crucible 12. In further outside thereof, an insulating material 15c is provided along an inner periphery face of the furnace main body 11. The heater 15a together with a controlling unit 15b constitutes a heating means 15.

On the other hand, to the upper side of the furnace main body 11, a cylindrical casing 11a more slender than the furnace main body 11 is connected. In the casing 11a, a wire 17 is suspended concentrically with the rotating shaft 14. To a lower end portion of the wire 17, a seed holder 17a is mounted and a seed crystal 17b is attached thereto. Subsequently, the seed crystal 17b is dipped into the melt 13 contained in the quartz crucible 12a, the crucible 12 and the seed crystal 17b are rotated and the seed crystal 17b is raised and the silicon single crystal 20 is grown on the lower end thereof.

For rotation and lifting of the seed crystal 17b, a wire lifting apparatus 19 is provided on the uppermost portion of the casing 11a though a wire rotating apparatus 18. The wire rotating apparatus 16 has a motor 18a and the wire 17 is rotated by driving the motor 18a. A wire lifting apparatus 19 has the motor 19a and the wire 17 is lifted by driving the motor 19a. Lifting means 16 is constituted by the wire 17, wire rotating apparatus 18, and wire lifting apparatus 19.

On a top portion of the furnace main body 11, an observation window 11b is provided. On the side opposite to the single crystal 20 with the observation window 11b inserted inbetween, a two dimensional CCD camera 31 is mounted. This CCD camera 31 is connected to an image processing unit 32 and a measuring and detecting unit 30 is constituted by these parts. The measuring and detecting unit 30 detects a brightness distribution in the vicinity of a fusion ring 21 formed around the single crystal 20 with the CCD camera 31 and processes this brightness distribution in the image processing unit 32 to calculate the diameter and the crystal deformation of the single crystal 20.

The diameter and the crystal deformation of the single crystal 20, calculated, are fed to temperature calculation/regulating means 33 and pulling rate computation/controlling means 34. Temperature calculation/regulating means 33 uses the measured diameter and crystal deformation of the single crystal to calculate an aimed temperature of the melt 13 and feeds this to a controlling unit 15b of the heating means 15. The controlling unit 15b controls a power of the heater 15a to achieve the aimed temperature. The pulling rate computing means 34 uses the measured crystal diameter and deformation to calculate the set value of the pulling rate for the next pulling run and supplies it to the wire lifting apparatus 19. The wire lifting apparatus 19 lifts the wire 17 in the next pulling run according to the given set value of the pulling rate.

Now, a method for setting the pulling rate in the next pulling run, important in the present invention, will be described below with reference to FIG. 2 and FIG. 3. This setting is carried out by the pulling rate computing means 34 as described above.

First, the single crystal 20 is pulled up with a standard pulling rate pattern. This pulling is called current pulling to distinguish it from the next pulling.

Figure 2:
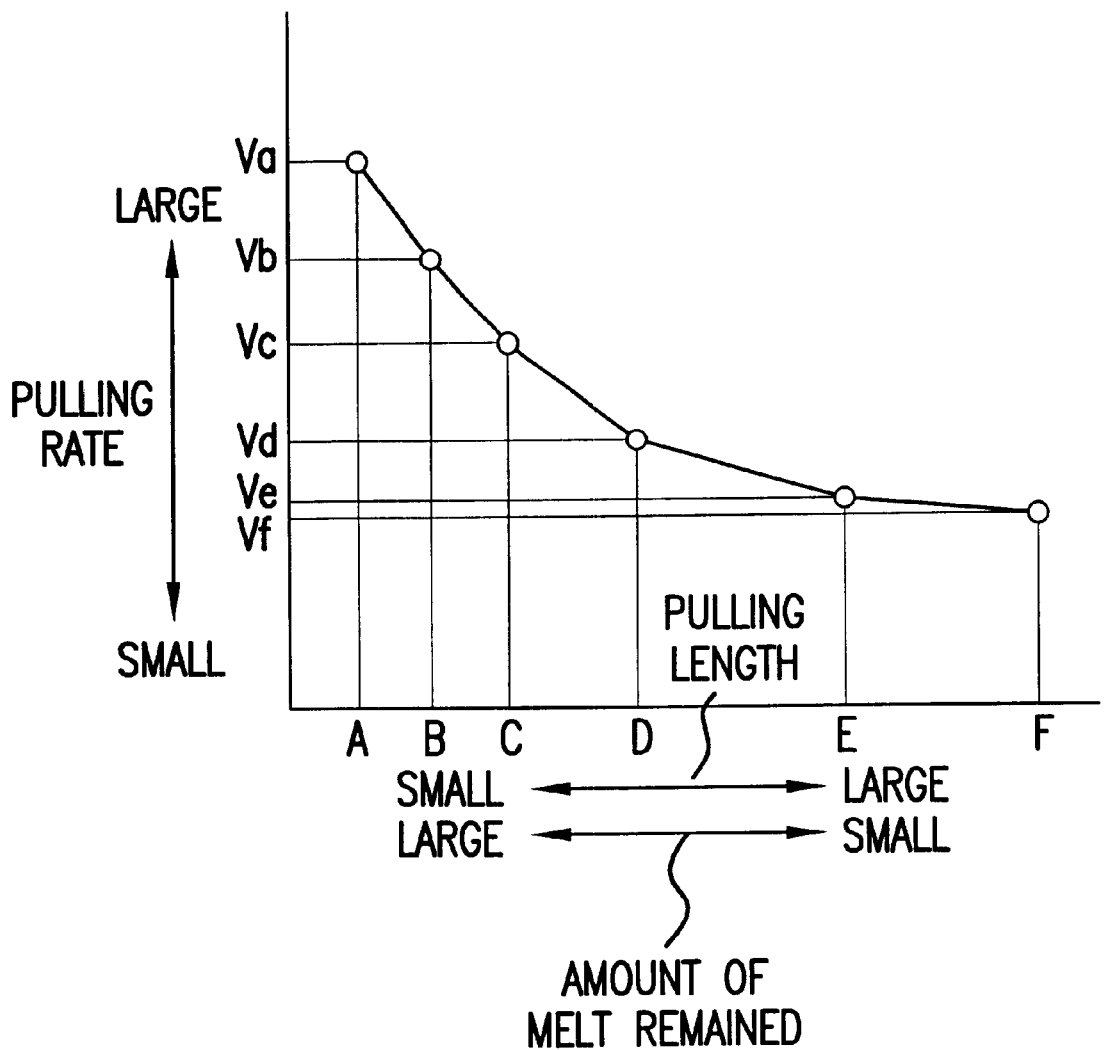
FIG. 2 is an illustration showing the pulling rate pattern of the single crystal.

The standard pulling rate pattern is illustrated in the FIG. 2. The pulling rate pattern is expressed by the pulling rate Va, Vb, Vc, ... set at a plurality of points A, B, C, ... with the transition of the pulling length. The pulling rate Va, Vb, Vc, ... at the plurality of points A, B, C, ... decreases monotonously. The number of these set points A, B, C, ... are selected to make the characteristics of the pulling rate pattern clear. In other words, in case of large change in pulling rate, set points are densely provided and in case of small, change in pulling rate, set points are coarsely provided. The pulling rate between adjacent set points is determined by interpolation of the pulling rate at set points of both sides.

Figure 3:
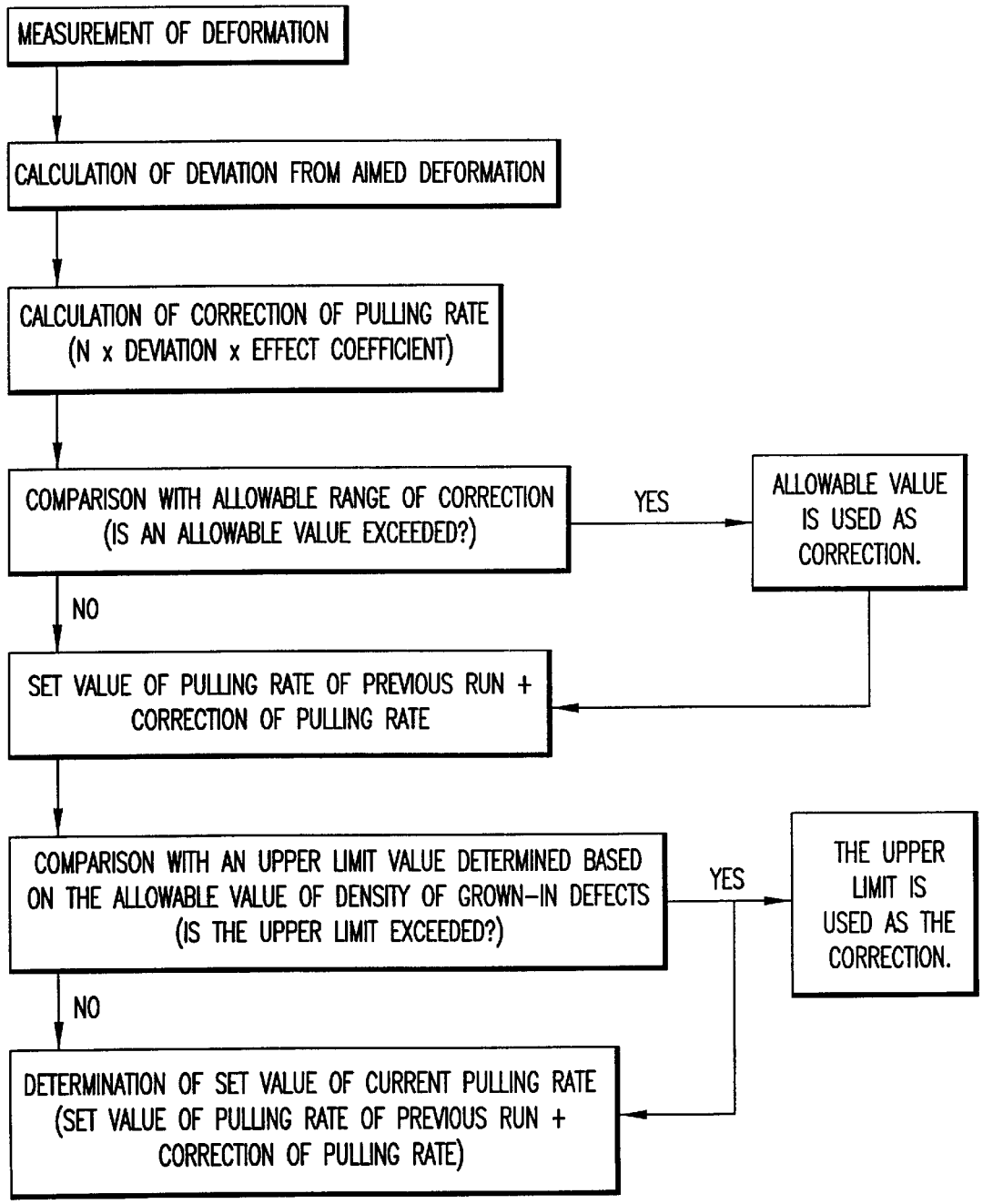
FIG. 3 is a flow chart showing the steps of setting the pulling rate.

In the current pulling, an operation of the FIG. 3 is conducted for the plurality of points A, B, C, . . . .

First, the achieved value $d_{ACT}$ of the crystal deformation is calculated from the measured crystal diameter. The achieved value $d_{ACT}$ calculated of the crystal deformation is compared with the aimed value $d_{AIM}$ thereof and calculate deviation $\Delta d$ ($d_{AIM}$-$d_{ACT}$) is determined. The aimed value $d_{AIM}$ of the crystal deformation is the value almost corresponding to the upper limit of deformation from the perfect circle of the section of the single crystal and has been previously calculated from a relation between deformation state and the deformation of an actual crystal pulled up.

Once the deviation $\Delta d$ of the crystal deformation is determined, this value is converted to the correction $\Delta V$ of the pulling rate. This conversion is carried out according to the following equation.

$\Delta V = N \times ef \times \Delta d$ $\Delta V$: deviation of pulling rate (mm/min)

N: gain being the value (-) falling within the range of 0.1 to 1.0 ef: effect coefficient [(mm/min)/percent]

$\Delta d$: deviation (%) of crystal deformation

When the correction $\Delta V$ of the pulling rate is calculated, this value is compared with the upper limit value $V_{MAX}$ of the correction $\Delta V$. Here, the upper limit value $V_{MAX}$ is the upper limit value of the pulling rate necessary to suppress the defect density of the crystal to the allowable range. If the correction $\Delta V$ calculated is below the upper limit value $V_{MAX}$, the correction $\Delta V$ is added to the set value of current pulling rate and the resulting value is used temporarily as the pulling rate of the next run. If the correction $\Delta V$ calculated is above the upper limit value $V_{MAX}$ thereof, the upper limit value is added to the predetermined value of current pulling rate and resulting value is used temporarily as the pulling rate of the next run.

After the set value of the pulling rate of the next run is temporarily determined in this way, this set value is compared with the upper limit value $V_{MAX}$ of the pulling rate. The upper limit value $V_{MAX}$ of the pulling rate is the upper limit value of the pulling rate necessary to suppress the density of the grown-in defects in the crystal section to the allowable range. This upper limit value $V_{MAX}$ has been previously calculated from the relation between distribution of the grown-in defects in the section of the actual crystal and pulling rate.

As a result of comparison of the temporary set value of the pulling rate of the next run with the upper limit value $V_{MAX}$, if the temporary set value is smaller than the upper limit value $V_{MAX}$, the set value is determined as the pulling rate of the next run. On the contrary, if the temporary set value is larger than the upper limit value $V_{MAX}$, the upper limit value $V_{MAX}$ is determined as the pulling rate of the next run. In other words, the temporary set value of the pulling rate of the next run is compared with the upper limit value $V_{MAX}$ and the smaller value is used as the set value of the pulling rate in the next run.

In this way, the set values of the pulling rate in the next pulling run are determined for the plurality of set points A, B, C, . . . .

In the next pulling run, pulling is carried cut according to these set values of the pulling rate. And using the set values of the pulling rate in this pulling as a reference, the set values of the pulling rate for the pulling run after next are determined by a similar procedure and this process is repeated for following runs.

In this way, an eight-inch silicon single crystal was produced. As the aimed value $d_{AIM}$ of the crystal deformation, the value of 1.4 percent obtained on the basis of a deformed shape of the single crystal pulled in the past without any problem was used as the upper limit of the crystal deformation. The gain in was set to 0.5. The gain N is ideally 1. However, because change in pulling rate has a sensitive effect on the crystal deformation and the like, an effect on the crystal deformation and the like is reduced by this gain N. Excessively low gain in causes insufficient reflection of current pulling achievement to setting process of the next pulling rate. A particularly preferable gain N ranges from 0.4 to 0.8.

Figure 4:
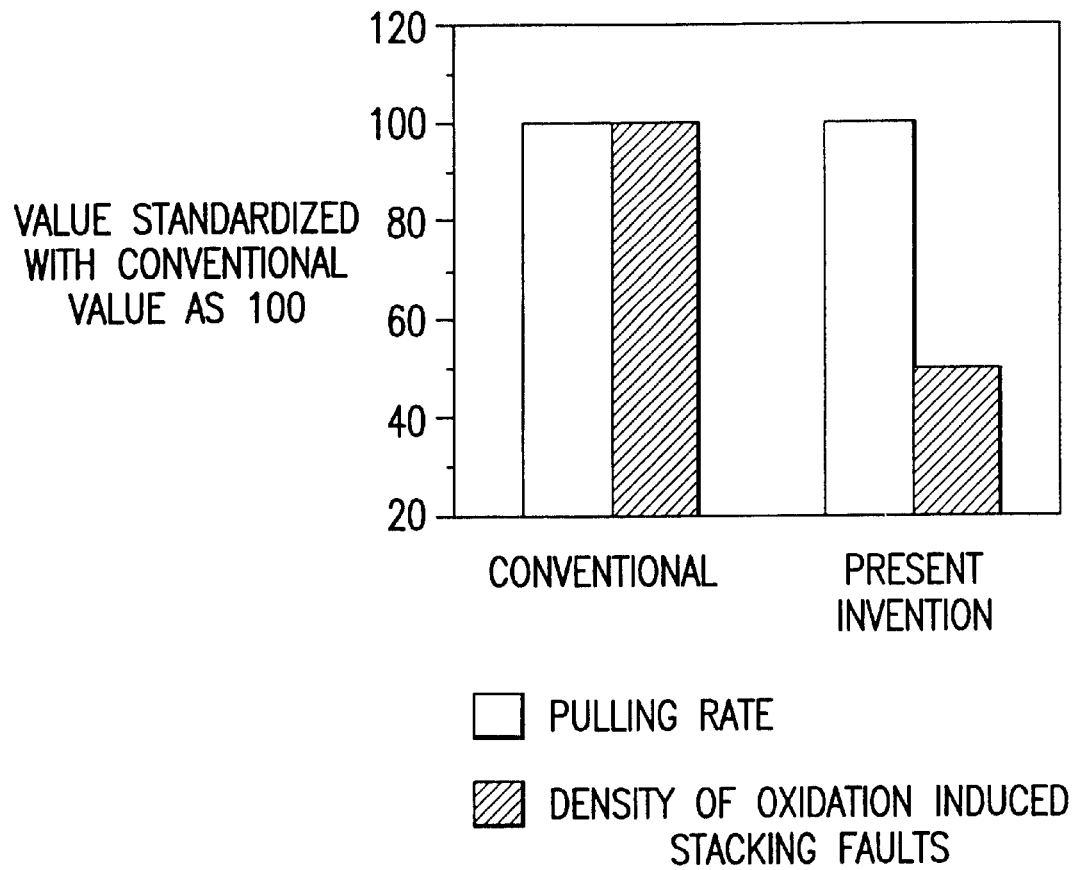
FIG. 4 is a chart showing a comparison of a result of the process according to this invention with that of the conventional process.

The result of operation is shown in FIG. 4 in comparison with that of conventional process. In comparison with the conventional process, the pulling rate increased 5 percent. The density of the grown-in defects did not, exceed the upper limit. The crystal deformation fluctuated around the aimed value and fell within the allowable range. The pulling rate increased 5 percent and the OSF ring-occurring region moved to the outer periphery resulted in 50-percent reduction of OSF density. For the sake of reference, the conventional process means specifically the pulling method using the pulling profile without the present method and in which the pulling rate is 5-percent smaller than the present method.

In the conventional process, if the prior art disclosed in the Japanese Patent Laid-Open No. 11-189489 is carried out, which is a method using only the pulling rate of the crystal as an index of the pulling rate setting, the crystal deformation is excessively relied on and thus, the pulling rate becomes too high so that the density of the grown-in defects exceeds the allowable upper limit.

As described above, the method for producing a single crystal according to the present invention can control the crystal deformation to the aimed value $d_{AIM}$ thereof resulting in a high yield. In addition, the density of the grown-in defects in the crystal section can be suppressed to the allowable range resulting in high quality. While satisfying these conditions, stable pulling can be carried out in a pulling rate as fast as possible resulting in a high productivity and reduction of the OSF density. Consequently, a semiconductor single crystal of high quality can be produced at low cost.

What is claimed is:

1. A method for producing a single crystal by growing a semiconductor single crystal from a melt by CZ method, wherein as an index of deformation of the single crystal from a perfect circle, an aimed value $d_{AIM}$ of a crystal deformation defined by (maximum diameter−minimum diameter)/minimum diameter of a crystal section is previously calculated; an upper limit value $V_{MAX}$ of a pulling rate necessary to suppress a defect density to an allowable range is calculated from distribution of grown-in defects in the crystal section; the single crystal is pulled up in a predetermined pulling rate; then deviation $\Delta d$ of an achieved value $d_{ACT}$ of the crystal deformation from said aimed value $d_{AIM}$ in pulling is determined, the deviation $\Delta_{AIM}$ is converted to a correction $\Delta V$ of the pulling rate, this correction $\Delta V$ is added to a set value of the pulling rate in said pulling, the pulling rate obtained by this addition is compared with said upper limit value $V_{MAX}$ and the smaller value is selected as the set value of the pulling rate for the following runs.

2. The method for producing a single crystal according to claim 1, wherein the aimed value of the crystal deformation is a value almost corresponding to an allowable upper limit of deformation from the perfect circle of the section of the single crystal.

3. The for producing a single crystal according to claim 1, wherein the correction $\Delta V$ (mm/min) of pulling rate is calculated according to the following equation:

$$\Delta V = N \times ef \times \Delta d$$

N: gain being a value (−) falling within a range of 0.1 to 1.0 ef: effect coefficient [(mm/min)percent]

$\Delta d$: deviation (%) of crystal deformation.

4. The method for producing a single crystal according to claim 1, wherein when the correction $\Delta V$ of the pulling rate is compared with the allowable upper limit, if the correction $\Delta V$ of the pulling rate exceeds the allowable upper limit, the allowable upper limit is used as the correction $\Delta V$ of the pulling rate.

5. The method for producing a single crystal according to claim 1, wherein the pulling rate is set at a plurality of points with the transition of a pulling length and the pulling rate at each point is set so that it decreases monotonously with the progress of pulling.

6. The method for producing a single crystal according to claim 1, wherein the crystal deformation is smoothed on the basis of achievement of a plurality of pulling runs to use it in setting the pulling rate for the following runs.

* * * * *